March 7, 1967 H. D. FRAZIER 3,307,984

METHOD OF FORMING DIODE WITH HIGH RESISTANCE SUBSTRATE

Filed Dec. 7, 1962

HENRY D. FRAZIER,
INVENTOR.

BY HIS ATTORNEYS.

Spensley & Horn.

United States Patent Office 3,307,984
Patented Mar. 7, 1967

3,307,984
METHOD OF FORMING DIODE WITH HIGH RESISTANCE SUBSTRATE

Henry D. Frazier, Rolling Hills Estates, Calif., assignor to TRW Semiconductors, Inc., a corporation of Delaware Filed Dec. 7, 1962, Ser. No. 243,021
2 Claims. (Cl. 148—187)

This invention relates to semiconductor devices and more particularly to an improved semiconductor device characterized by low junction capacitance and low leakage current.

In the art of solid state electronics, the use of semiconductor materials and semiconductor devices for rectifying and controlling electrical signals is now well known. Basic to the theory of operation of semiconductor devices is the concept that current may be carried in two distinctly different manners; namely, "conduction by electrons" or "excess electron conduction," and "conduction by holes" or "deficit electron conduction." The fact that electrical conductivity by both of these processes may occur simultaneously and separately in a semiconductor specimen affords a basis for explaining the electrical behavior characteristics of semiconductor devices. One manner in which the conductivity of a semiconductor specimen may be established is by the addition of active impurities to the basic semiconductor material. The term "semiconductor material," as utilized herein, is considered generic to material such as germanium, silicon, and germanium-silicon alloys and compounds such as silicon-carbide, indium-antimonide, gallium-antimonide, aluminum-antimonide, indium-arsenide, gallium-arsenide, gallium-phosphorus alloys, indium-phosphorus alloys and the like.

In the semiconductor art, the term "active impurities" is used to denote those impurities which affect the electrical characteristics of the semiconductor material as distinguished from other impurities which have no appreciable effect upon these characteristics. Generally, active impurities are added intentionally to the semiconductor material to produce single crystals having predetermined electrical characteristics. Active impurities are classified as either donors such as antimony, arsenic, bismuth and phosphorus, or acceptors such as indium, gallium, boron, and aluminum. A region of semiconductor material containing an excess of donor impurities and yielding an excess of free electrons is considered to be an impurity doped N type region. An impurity doped P type region is one containing an excess of acceptor impurities resulting in a deficit of electrons, or stated differently, an excess of holes. In other words, an N type region is one characterized by electron conduction while a P type region is one characterized by hole conduction.

A heavily doped region of N type conductivity may alternately be referred to as an $N^+$ region, the + indicating that the concentration of the active impurity in that region is significantly greater than the minimum required to determine the conductivity type. Similarly, a $P^+$ type region would indicate a more heavily than normal doped region of P type conductivity. The use of this terminology enables a heavily doped region to be readily distinguished from a normally doped region of the same conductivity type in the same semiconductor body.

When a continuous, solid crystal specimen of semiconductor material has an N type region adjacent a P type region, the boundary between them is termed a PN or an NP junction and the specimen of semiconductor material is termed a PN junction semiconductor device. These PN and NP junctions are referred to as "rectifying junctions."

When donor impurity atoms are diffused into an N type semiconductor starting crystal of a given resistivity, a diffused N type region of a different resistivity is produced. The gradation between these two regions of similar conductivity type but of differing resistivity is termed a "non-rectifying junction." Hence, the term "junction," as utilized herein, is intended to include both rectifying and non-rectifying junctions. A rectifying junction establishes a high-resistance interfacial condition between two contacting semiconductor regions of opposite conductivity types thereby resulting in a high impedance barrier which effectively electrically isolates one region from the other. A non-rectifying junction establishes an interfacial condition between two contacting semiconductor regions of the same conductivity type, the impedance of the interfacial barrier depending upon the relative resistivities of the two semiconductor regions. Non-rectifying junctions are typically used in the establishment of ohmic contacts by doping a surface of a semiconductor body with the same conductivity type impurity to provide a surface region of lower resistivity than that of the underlying semiconductor material, the relative resistivities of the two contacting semiconductor regions providing a fairly low impedance interfacial barrier so that the regions are electrically interconnected. However, if the relative resistivities of the two contacting semiconductor regions of the same conductivity type differ by a significantly large ratio, the resulting non-rectifying junction will provide a high impedance barrier to effectively electrically isolate one region from the other. The present invention concepts are based upon novel combinations of rectifying and non-rectifying junctions wherein the resistivities of certain contacting regions differ greatly to electrically isolate those regions from each other, thereby enabling a semiconductor device structure wherein a rectifying junction is effectively buried within the semiconductor crystal body. The present invention structure is particularly suitable for use in junction semiconductor diodes, although the present invention concepts may be advantageously employed in the fabrication of multi-junction semiconductor devices.

In the past, the rectifying junctions of diffused junction semiconductor devices were formed by the diffusion of an active impurity over an entire major surface of a semiconductor wafer, the rectifying junction terminating at the edge surfaces of the wafer. Since the presence of any contaminants or irregularity at the junction terminations may seriously deleteriously affect the electrical characteristics of the device, some sort of protective or passivation coating is typically applied over the device most importantly to isolate the junction from the ambient. In accordance with the more recent manufacturing techniques, the active impurity atoms are diffused only into portions of the major surfaces of the wafer so that the junctions terminate in the major wafer surface rather than at the edge surfaces. Since a major surface of the wafer is a considerably larger and more perfect surface than the edge, this technique facilitates the passivation effect of whatever coating may be applied. Yet, at the present state of the art, it is still necessary to apply a passivation coating to prevent undesirable leakage across rectifying junctions.

Furthermore, in both of the aforementioned prior art diffusion techniques, it is very difficult to precisely control the junction area, and therefore the capacitance characteristics, the major portion of the junction area being formed by a high impedance interface extending approximately parallel to the semiconductor wafer surface into which the active impurity atoms are diffused. When using the aforementioned recent manufacturing technique in which the rectifying junction terminates in a planar surface of the semiconductor crystal, a major portion of the junction area is usually in the form of a circular disc, the junction area varying primarily as the square of variations in the circle diameter. With such junction configurations, the junction capacitance is relatively high and the capacitance at zero bias is directly proportional to the square of the circle diameter. It is therefore readily apparent that it is quite difficult to exactly reproduce a given set of device characteristics due to the greatly magnified effect of variations in junction diameter. The present invention is directed toward diffused junction semiconductor device structures in which the junction area can be precisely controlled on a mass production basis, the present invention structure providing a relatively large junction area concurrent with low junction capacitance. Also, the present invention structure obviates the problem of leakage across junction terminations without the necessity of using a passivation coating.

Accordingly, it is an object of the present invention to provide improved semiconductor devices.

It is also an object of the present invention to provide improved diffused junction semiconductor diodes.

It is another object of the present invention to provide improved diffused junction semiconductor devices characterized by a relatively large junction area concurrent with small junction capacitance.

It is a further object of the present invention to provide an improved diffused junction semiconductor device structure which can be mass produced with a close control over junction capacitance.

It is a still further object of the present invention to provide improved diffused junction semiconductor devices characterized by extremely low leakage currents.

It is yet another object of the present invention to provide improved diffused junction semiconductor devices in which the junctions are completely buried within the semiconductor device.

It is still another object of the present invention to provide a junction semiconductor device structure wherein the rectifying junction is contained within a thin surface region, the remaining major portion of the semiconductor body being electrically inactive.

The objects of the present invention are generally accomplished by a semiconductor device structure wherein the rectifying junction is of a tubular configuration. The desired tubular configuration is achieved by utilizing a semiconductor crystal body having low resistivity first and second regions of opposite conductivity types, the second region being in the form of a cylinder extending from a surface of the crystal body through the first region and into a high resistivity third region contiguous with the first region, the resistivity of the third region being sufficiently greater than the resistivity of the first and second regions so that the junctions between them produce high impedance interfacial barriers which electrically isolates the third region from the first and second regions. Electrical connections are made to the first and second regions, the rectifying junction between these regions being in the form of an open tube. The first region can be a surface region or, alternatively, can be an underlying region covered by a high resistivity surface region to thereby effectively bury the entire rectifying junction within the semiconductor crystal body. Hence, only the first and second regions are electrically active, the high-resistivity third region being electrically inactive. The desired structure is conveniently attainable by the use of standard diffusion and gold doping techniques whereby the first and second regions can be thin diffused regions in a semiconductor crystal of high resistivity, the high resistivity main portion of the semiconductor crystal forming the third region and providing only structural rigidity since it is electrically inactive. To insure against possible electrical leakage, the third region should have a resisitivity of not less than about 50 ohm-cm. and a lifetime not in excess of about 0.1 microsecond.

The novel features which are believed to be characteristic of the invention, both as to its organization and method of operation, together with further objects and advantages thereof, will be better understood from the following description considered in connection with the accompanying drawing in which presently preferred embodiments of the invention are illustrated by way of example. It is to be expressly understood, however, that the drawing is for the purpose of illustration and description only, and is not intended as a definition of the limits of the invention.

Figure 1:
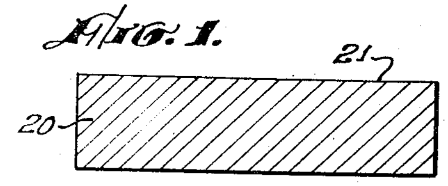
FIGURE 1 is a sectional view, in elevation, of a starting crystal wafer.

Turning now to the drawings, and more particularly to FIGURES 1–6, there are illustrated various steps in the production of a first embodiment of a diode fabricated in accordance with the present invention concepts. In the fabrication of this first embodiment, a gold doping technique is utilized to selectively increase the resistivity of the inactive region of the semiconductor material while killing its lifetime. FIGURE 1 shows a sectional view of a starting semiconductor crystal wafer 20. The starting crystal may be of either P or N type conductivity material since the major portion of it will be subsequently gold doped to intrinsic or to a very high resistivity and will be electrically inactive, as will be explained hereinbelow. The resistivity of the starting crystal must be in excess of about 2 ohm-cm. so that it can be effectively gold doped. In the illustrated example, the wafer 20 is a silicon crystal of N type conductivity and 100 ohm-cm. resistivity. The wafer 20 may be of any desired thickness to provide structural rigidity since only a small portion of the thickness is utilized as the active portion of the resulting diode. It is presently preferred to utilize a wafer approximately 20 mils thick.

Figure 2:
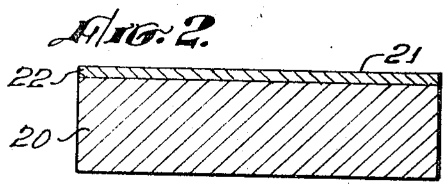
FIGURES 2–4 are sectional views, in elevation, showing the starting crystal wafer of FIGURE 1 in various successive stages of production of a first semiconductor diode embodiment.
Figure 8:
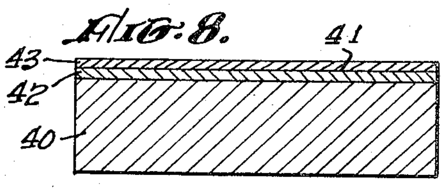

The first step in the fabrication of the diode of the present invention is to polish the upper face 21 of the wafer and to diffuse N type active impurity atoms into the upper surface 21 to create a low resistivity $N^+$ region 22, approximately 1 micron deep, extending into the wafer 20 from its upper surface. The final resistivity of the $N^+$ region 22 is set at the peak resistivity which gives the desired reverse breakdown characteristic. In the illustrated embodiment, the donor atom diffusion must establish an $N^+$ region having a resistivity less than 2 ohm-cm. so that it will not be significantly affected by the subsequent gold doping. Any well-known diffusion process can be used, such as for example, an open tube diffusion using phosphorus as the impurity. In this diffusion operation, the wafer 20 is heated to a temperature of about 1100° C. in a $P_2O_5$ atmosphere for about ten to fifteen minutes, the edge and bottom surfaces of the wafer 20 being masked to prevent the penetration of phosphorus atoms therein, thereby resulting in an $N^+$ region 22 of about 0.02 ohm-cm. resistivity. Upon completion of the diffusion process, and removal of the maskant and the oxide coating formed during the course of the diffusion process, the wafer 20 will appear as shown in FIGURE 2.

The second production step is to establish an oxide coating 24 and the surfaces of the wafer 20 using any well-known method, such as thermal oxidation or the pyrolysis of ethyl silicate, for example. It is presently preferred to establish the oxide coating by thermal oxidation of the wafer for approximately 30 minutes at a temperature of 1100° C. During the oxidation process, the phosphorus atoms diffuse deeper into the wafer 20 to increase the thickness of $N^+$ surface region 22 to about 5 to 10 microns.

A central hole 25 is then created through the oxide coating 24 on the upper surface of the wafer 20 for the purpose of confining a diffusion operation to a precise geometrical pattern. Since, in this illustrated embodiment, a tubular PN junction of circular cross-section is to be formed, the hole 25 is a circular one. A circular portion of the oxide coating can be removed by a silk screening decal, or by a photolithographic method such as the so-called photo-resist process.

Figure 3:
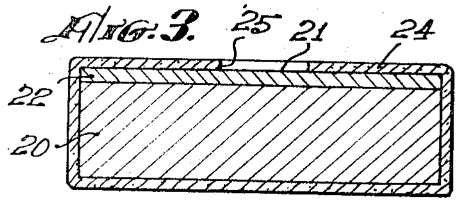

In the presently preferred method, the photo-resist process is employed. In this process, a layer of photo-sensitive material, such as glue-albumen, lithographer's coating or Kodak photo-resist, is applied to the oxide coated upper surface of the crystal wafer. The photo-resist upper layer is exposed to an actinic light source which renders the exposed area insoluble in a suitable developing solvent and leaves a masking layer corresponding to the pattern of exposure. Materials suitable as solvents for the photo-resist material are well known, as for example, trichlorethylene. After development of the photo-resist form and removal of a central circular portion therefrom the remaining photo-resist material will mask the underlying oxide layer against etchants whereas the central circular area of the oxide layer over which the photo-resist material has been removed can be exposed to an etchant which will dissolve the underlying oxide layer in a desired pattern. Accordingly, an etchant such as 48% hydrofluoric acid is applied to the masked upper surface of the semiconductor wafer 20 to etch away the exposed circular portion and expose a central circular portion of the underlying $N^+$ region 22. The remaining portion of the photo-resist layer is then removed by any well-known method, such as by scrubbing with solvent soaked swabs to again expose the remaining portions of the masking oxide layer 24, the wafer 20 then appearing as shown in FIGURE 3.

Figure 4:
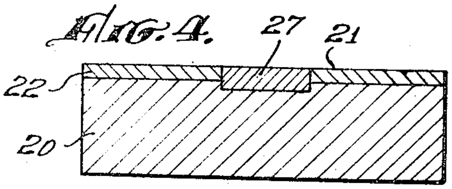

The next step in the production process is to diffuse a region of P type conductivity into the exposed surface of the wafer 20. Again, any well-known diffusion process can be used, such as for example, an open tube diffusion using boron as the active impurity. In an exemplary open tube diffusion operation, the wafer 20 is heated to a temperature of about 1100° C. in a $B_2O_3$ atmosphere for approximately 30 minutes. Upon completion of this diffusion step, a cylindrical P type region 27 will be formed, the region 27 extending through the $N^+$ region 22 and into the remaining high resistivity N type silicon of the wafer 20. The remaining portion of the oxide coating 24 is then removed preparatory to gold doping, the wafer 20 then appearing as shown in FIGURE 4.

Gold doping is a method well known in the art for killing lifetime by the injection of recombination traps. The gold doping technique is somewhat selective in that it substantially increases the resistivity of semiconductor material having a resistivity greater than about 2 ohm-cm. and has little effect upon the resistivity of semiconductor material having a resistivity less than about 2 ohm-cm. It is readily apparent that this selective effect can be utilized to advantage to greatly increase the resistivity of the inactive region of the semiconductor material during the fabrication of a semiconductor device in accordance with the present invention. Thus, the wafer 20 is gold doped for about 3 hours at approximately 900° C., the gold doping having little effect upon the $N^+$ region 22 and the P region 27, but increasing the resistivity of the remaining 100 ohm-cm. silicon to about 40,000 ohm-cm. and reducing its lifetime to less than 0.1 microsecond. It is readily apparent that the gold doping step can be made more extensive than the illustrative example to convert the remaining 100 ohm-cm. silicon to intrinsic material. In any event, in order to insure the desired effect of the gold doping step the bulk semiconductor material should have a resistivity in excess of 2 ohm.-cm. this bulk resistivity being at least ten times the resistivity of the diffused regions forming the electrically active portions of the device. Since the gold doping technique is well known in the art, it will not be discussed in detail. Furthermore, there are various other known methods for injecting recombination traps, and their applicability will be apparent to those skilled in the art.

Figure 5:
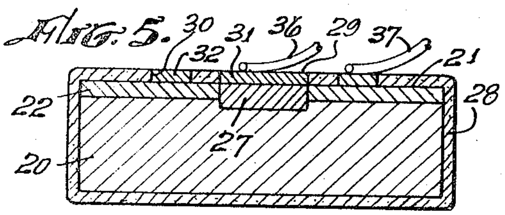
FIGURE 5 is a sectional view, in elevation, of the completed first semiconductor diode embodiment.
Figure 6:
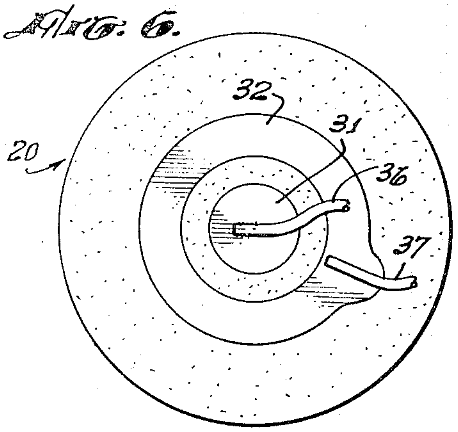
FIGURE 6 is a plan view of the completed first semiconductor diode embodiment.

The next production step is to establish an oxide coating 28 on the surfaces of the wafer 20, again using any well-known method, and create a central circular opening 29 and an annular hole 30 through the oxide coating 28, the circular opening 29 exposing the P region 27 and the annular hole 30 surrounding the circular opening 29, exposing the $N^+$ region 22. Again, a photo-resist technique can be utilized, the etching step dissolving the oxide in the desired pattern and exposing the underlying surface of the $N^+$ region 22. Next, metalized regions are formed in ohmic contact with the exposed surface portions of the P region 27 and the $N^+$ region 22 to provide for electrical connections thereto. A disc-shaped metalized region 31 is formed on the P region 27 through the central opening 29, and an annular shaped metalized region 32 is formed on the $N^+$ region 22 through the annular hole 30. Suitable metalizing, chemiplating, sputtering, evaporation or like techniques can be utilized to form the metalized regions 31 and 32. A particularly suitable method is that disclosed and claimed in U.S. Patent No. 2,995,473, entitled, "Method of Making Electrical Connection to Semiconductor Bodies," issued to Clifford A. Levi on August 8, 1961, and also assigned to the present assignee. One end of an electrical lead 36 is bonded in low resistance ohmic contact to the metalized region 31 and one end of an electrical lead 37 is bonded in low resistance ohmic contact to the annular metalized region 32, thereby providing electrical contact respectively to the P region 27 and the $N^+$ region 22. Section and plan views of the completed diode are shown in FIGURES 5 and 6.

In this first illustrative embodiment, the bulk of the semiconductor wafer 20, being of high resistivity silicon (about 40,000 ohm-cm., upon completion of the device), is electrically inactive and merely provides structural support for the electrically active portions of the device. The electrically active portions of the device are the low resistivity P and $N^+$ type regions 27 and 22, these regions being effectively electrically isolated from the remaining high resistivity portion of the semiconductor body by the high impedance barrier formed by the junctions therebetween, the resistivity of the bulk of the crystal wafer 20 being very much greater than the resistivity of the P and $N^+$ regions 27 and 22. This particular structure provides a rectifying junction in the shape of a hollow tube, the diameter of the tube being the diameter of the P region 27 and the effective length of the tubular junction being the thickness of the $N^+$ region 22. Although a PN interface exists between the lowermost end portion of the P type region 27 and the high resistivity N type silicon material of the wafer 20, this interface is electrically inactive due to the extremely high resistivity of the N type base material. Effectively, the high resistivity N type base material appears as an insulator since the P and $N^+$ regions 27 and 22 are of very low resistivity, and the flow of electrical current across the PN barrier is confined to the interface between the P region 27 and the $N^+$ region 22. In direct contrast, the main portion of the rectifying junction area of typical prior art structures is a disc-shaped area defining the bottom or innermost surface of the diffused P type region, the tubular side portions of the junction extending upward to the surface of the wafer being of much smaller area than the bottom disc portion. In these prior art structures, the junction area effectively varies as the square of the diameter of the diffused region, while in the present invention tubular junction structure the junction area varies directly as the diameter of the diffused region. It is readily apparent that the present invention form of junction structure is more capable of exact reproduction since junction area varies linearly rather than with the square of the lateral dimension of the diffused region. By confining the active portions of the device to a thin skin on the surface of a high resistivity semiconductor body, the device capacitance is kept very low, thereby enabling the use of such devices at high frequencies and in parallel combinations as high speed switching devices.

Thus, in the hereinabove described first embodiment, the semiconductor crystal wafer has thin low resistivity first and second regions of opposite conductivity types ($N^+$ region 22 and P region 27) and a high resistivity third region (the remainder of the crystal body), with only the first and second regions being electrically active, the third region merely providing structural rigidity. However, it is readily apparent that the three regions may be of other relative thicknesses and be formed in various other manners. For example, the aforementioned high resistivity third region need not be the entire remaining portion of the crystal wafer, but may be an intermediate region adjacent the second region, the remainder of the wafer being usable for other purposes such as passive circuitry or another active electrical translating element.

Figure 7:
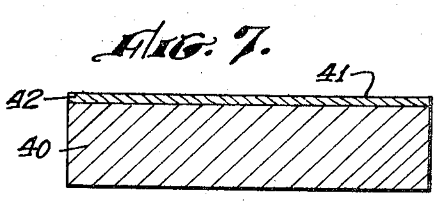
FIGURES 7–11 are sectional views, in elevation, showing a crystal wafer in various successive stages of production of a second semiconductor diode embodiment.

Turning now to FIGURES 7–12 of the drawing, there are illustrated various steps in the production of a second embodiment utilizing the present invention concepts, this second embodiment being similar to that shown in FIGURES 1–6 with the added advantage that the active rectifying junction is completely buried within the semiconductor crystal. By burying the junction completely within the semiconductor crystal, there is no exposed junction termination, thereby resulting in extremely low leakage currents and an elimination of the necessity of a passivation coating. To achieve this desired configuration, fabrication is begun in a manner similar to that of the hereinabove-described first embodiment. Into a starting semiconductor crystal wafer 40 of N type conductivity and of a relatively high resistivity, there is diffused N type active impurity atoms into the upper surface 41 to create a low resistivity $N^+$ region 42 approximately 5–10 microns deep extending the wafer from its upper surface. In this illustrative example, the wafer 40 is a silicon crystal of 100 ohm-cm. resistivity and the $N^+$ region 42 is of one ohm-cm. resistivity or less. Again, any well known diffusion process can be used to form the $N^+$ region 42. Upon completion of the diffusion process, and removal of any maskant and the oxide coating formed during the course of diffusion process, the wafer will appear as shown in FIGURE 7.

The next production step is to create an N type region 43 on the upper surface of the $N^+$ region 42, such as by the epitaxial growth process now well known in the art. The resistivity of the N type surface region 43 is in excess of 100 ohm-cm., the resulting structure being illustrated in FIGURE 8. Thus, the $N^+$ region 42 is effectively sandwiched between high resistivity N regions. An alternative method of forming the N type region 43 is by an out-diffusion process wherein N type active impurity atoms are removed from the immediate upper surface 41 of the wafer to a depth of approximately 1 or 2 microns. When utilizing the out-diffusion process, the upper surface 41 of the wafer 40 will be converted to a high resistivity N type region of approximately 1 or 2 microns depth, beneath which is the remaining low resistivity portion of the $N^+$ region 42.

Figure 9:
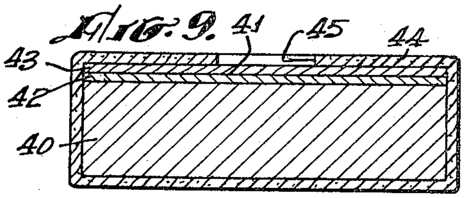

Next, a sterile oxide coating 44 is grown or otherwise established on the surfaces of the wafer, and a central circular hole 45 is created through the oxide coating 44 on the upper surface of the wafer for the purpose of confining a diffusion operation to a precise circular pattern. Upon removal of the circular portion of the oxide coating 44 by any of the hereinabove-described methods, a circular portion of the expitaxially grown N layer 43 will be exposed, the wafer 40 then appearing as shown in FIGURE 9.

Figure 10:
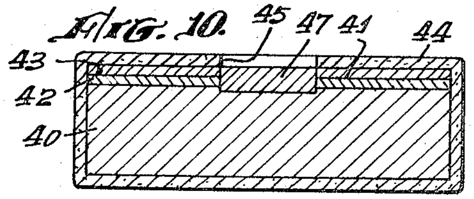

The next step in the production process is to diffuse a region of P type conductivity into the exposed surface of the wafer 40 to form a cylindrical P region 47, the region 47 extending through the N region 43, the $N^+$ region 42, and into the remaining high resistivity N type silicon of the wafer 40, as shown in FIGURE 10. The resistivity of the P region 47 is less than one ohm-cm.

Figure 11:
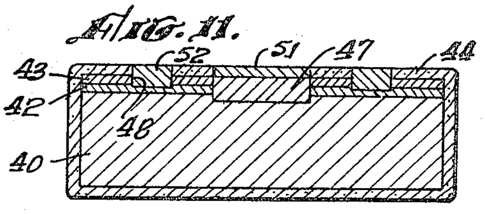

The next production step is to create an annular hole 48 through the sterile oxide coating 44, surrounding the central circular opening 45 and extending through the N type region 43 to expose the underlying $N^+$ region 42. Next, metallized regions are formed in ohmic contact with the exposed surface portions of the P region 47 and the $N^+$ region 42 to provide for electrical connections thereto. A disc-shaped metallized region 51 is formed on the P region 47 through the hole 45, and an annular shaped metallized region 52 is formed on the $N^+$ region 42 through the annular opening 48. Again, suitable metallizing, chemiplating, sputtering, evaporation or like techniques can be utilized to form the metallized regions 51 and 52. Upon completion of this production step, the wafer 40 will appear as shown in FIGURE 11. In this second illustrative embodiment, the resistivities of the bulk of the semiconductor wafer 40 and the surface region 43 are at least 100 times the resistivities of the $N^+$ region 42 and the P region 47. Hence, only the regions 42 and 47 are electrically active and the rectifying junction between them is in the form of a tube having as its length the thickness of the $N^+$ region 42, the rectifying junction being effectively buried within the semiconductor body with no exposed active junction terminations.

Figure 12:
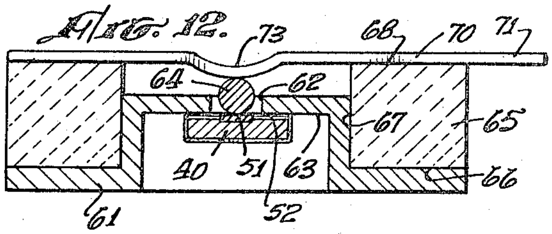
FIGURE 12 is a sectional view, in elevation, of the completed second semiconductor diode embodiment.

In FIGURE 12 of the drawings, there is shown a completed diode structure in accordance with the second illustrative embodiment, wherein electrical connections to the semiconductor body have been made through the use of an intermediate mounting structure. A Kovar header member 61 is provided with a central aperture 62 extending through a disc-shaped central portion 63. The wafer 40 is bonded to the raised portion 63, as shown, with the annular metallized region 52 in ohmic contact with the Kovar header member 61, and with the disc-shaped metallized region 51 centered within the aperture 62 in the header member. Electrical contact to the disc-shaped metallized region 51 is made by means of a platinum or silver ball bonded to the region 51. Such ball-shaped electrical contacts are well known in the art and their method of formation will not be discussed in detail. Mounted to the main portion of the header member 61, surrounding the raised portion 63 thereof, is an annular ceramic casing element 65, the bottom surface 66 and inner wall surface 67 of the ceramic casing being bonded to the Kovar header 61 in a ceramic-to-metal seal. Sealed to the upper surface 68 of the ceramic casing element 65 is a generally disc-shaped metallic closure element 70, the closure element 70 having a projecting tab portion 71. A central indentation 73 in the closure member 70 provides physical contact between the closure member and the ball contact 64, low resistance electrical contact being assured by thermo-compression bonding of the closure member indentation to the contact ball. This completed diode structure is intended to be mounted to an end of a cylindrical electrode pin, not shown, by welding of the header member 61 to the pin end. The electrode pin thus provides one electrical contact for the device, and the projecting tab 71 on the closure member 70 provides the other electrical contact. Other forms of encapsulating structures and other methods of making electrical contact to the devices will be apparent to those skilled in the art. For example, the closure member 70 can be eliminated and electrical connection made by bonding one end of an electrical lead wire directly to the ball contact 64. Or, the ball contact 64 can be eliminated and electrical connection made directly to the metallized region 51, such as by bonding an electrical lead wire or forming a deeper indentation in the closure member to physically contact the metallized region.

Thus, there have been described novel semiconductor device structures in which junction areas can be precisely controlled, the devices being characterized by relatively large junction areas concurrent with low junction capacitance. There have also been described semiconductor device structures in which the rectifying junctions are effectively varied within the semiconductor crystal bodies, thereby eliminating the necessity of a passivation coating. The present invention was illustrated by practical embodiments of semiconductor diodes, it being readily apparent, however, that the present invention concepts are equally applicable to multi-junction devices. Hence, although the invention has been described with a certain degree of particularity, it is understood that the present disclosure has been made only by way of example and that numerous changes in the details of construction and the combination and arrangement of parts may be resorted to without departing from the spirit and scope of the invention as hereinafter claimed. For example, although the tubular rectifying junctions of the illustrated embodiments were of circular cross section, various other suitable geometrical cross-sectional configurations will be apparent to those skilled in the art. Similarly, although metallized contact areas of circular and annular shapes were illustrated, other shapes are suitable in accordance with the configuration of the semiconductor crystal body forming the heart of the device.

What is claimed is:

1. The method of manufacturing a diffused junction semiconductor diode from a unitary silicon starting crystal wafer having a resistivity in excess of two ohm-centimeters, including the steps of:

(a) diffusing atoms of a conductivity determining type active impurity into a predetermined surface of said starting crystal wafer to establish a first surface region of one conductivity type therein, the resistivity of said first surface region being less than 2 ohm-centimeters;

(b) diffusing atoms of another conductivity determining type active impurity into a portion of said predetermined surface of said starting wafer to establish a second surface region of the opposite conductivity type from said first surface region and extending through said first surface region to form a rectifying junction of tubular configuration therebetween, the resistivity of said second surface region being less than two ohm-centimeters;

(c) gold doping said starting crystal wafer to increase the resistivity of that portion of the wafer having a resistivity in excess of two ohm-centimeters to a value in excess of 100 times the resistivity of said first and second surface regions and to reduce its lifetime to a value not in excess of 0.1 microsecond;

(d) establishing low resistance ohmic contact to said first surface region; and, (e) establishing low resistance ohmic contact to said second surface region.

2. The method of manufacturing a diffused junction semiconductor diode from a unitary silicon starting crystal wafer having a resistivity in excess of two ohm-centimeters, including the steps of:

(a) diffusing atoms of a conductivity determining type active impurity into a predetermined surface of said starting crystal wafer to establish a first surface region of one conductivity type therein, the resistivity of said first surface region being less than two ohm-centimeters;

(b) diffusing atoms of another conductivity determining type active impurity into a portion of said predetermined surface of said starting wafer to establish a second surface region of the opposite conductivity type from said first surface region and extending through said first surface region to form a rectifying junction of tubular configuration therebetween, the resistivity of said second surface region being less than two ohm-centimeters;

(c) gold doping said starting crystal wafer to increase the resistivity of that portion of the wafer having a resistivity in excess of two ohm-centimeters to effectively electrically isolate that portion of the wafer having the initial resistivity in excess of two ohm-centimeters from said first and second regions and to reduce its lifetime to a value not in excess of 0.1 microsecond;

(d) establishing low resistance ohmic contact to said first surface region; and (e) establishing low resistance ohmic contact to said second surface region.

References Cited by the Examiner

UNITED STATES PATENTS

| | | | |
|---|---|---|---|
| 2,954,307 | 9/1960 | Shockley | 148—187 |
| 2,975,344 | 3/1961 | Wegener | 317—235 |
| 3,105,177 | 9/1963 | Aigrain et al. | 317—234 |
| 3,114,864 | 12/1963 | Sah | 317—245 |
| 3,121,808 | 2/1964 | Kahng et al. | 317—234 |
| 3,183,128 | 5/1965 | Leistiko | 148—187 |
| 3,184,347 | 5/1965 | Hoerni | 317—235 X |
| 3,197,681 | 7/1965 | Broussard | 317—235 |
| 3,242,395 | 3/1966 | Goldman et al. | 317—235 |

DAVID J. GALVIN, *Primary Examiner.*